(12) United States Patent
Yabuki et al.

(10) Patent No.: US 9,756,746 B2
(45) Date of Patent: Sep. 5, 2017

(54) MOVABLE DISPLAY DEVICE

(71) Applicant: ALPINE ELECTRONICS, INC., Shinagawa-ku, Tokyo (JP)

(72) Inventors: Kiminori Yabuki, Iwaki (JP); Akira Homma, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 0 days.

(21) Appl. No.: 15/277,022

(22) Filed: Sep. 27, 2016

(65) Prior Publication Data

US 2017/0142852 A1    May 18, 2017

(30) Foreign Application Priority Data

Nov. 16, 2015   (JP) .................................. 2015-224235

(51) Int. Cl.
    *H05K 5/02*       (2006.01)
    *H05K 5/00*       (2006.01)

(52) U.S. Cl.
    CPC ......... *H05K 5/0217* (2013.01); *H05K 5/0017* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,847,685 A * | 12/1998 | Otsuki | ................... | B60K 35/00 248/920 |
| 6,011,685 A * | 1/2000 | Otsuki | ................... | B60K 35/00 340/980 |
| 6,711,003 B2 * | 3/2004 | Nakasuna | ........... | B60R 11/0235 248/476 |
| 7,119,790 B2 * | 10/2006 | Tadokoro | ............. | H05K 5/0017 345/156 |
| 7,529,080 B2 * | 5/2009 | Koutari | ................ | G01C 21/265 312/7.2 |
| 7,597,290 B2 * | 10/2009 | Sugiura | ................... | B60R 11/02 248/27.3 |
| 7,660,103 B2 * | 2/2010 | Ozaki | .................. | G01C 21/265 248/917 |
| 8,130,329 B2 * | 3/2012 | Sano | ...................... | B60K 35/00 348/836 |
| 9,345,155 B1 * | 5/2016 | Schmuckle | .......... | H05K 5/0017 |

FOREIGN PATENT DOCUMENTS

| | | |
|---|---|---|
| JP | 10-051712 | 2/1998 |
| JP | 2006-276769 | 10/2006 |

* cited by examiner

*Primary Examiner* — Lisa Lea Edmonds
(74) *Attorney, Agent, or Firm* — Brinks Gilson & Lione (57) ABSTRACT

An upper guide and a lower guide are provided on an escutcheon integrally attached to the chassis. An upper movable pin engageable with and disengageable from the upper guide, a lower movable pin engageable with and disengageable from the lower guide, and a fulcrum switching mechanism that reciprocates the upper movable pin and lower movable pin in the left-right direction are attached to a display body disposed in front of the escutcheon. The fulcrum switching mechanism makes the rotational fulcrum of the display body switchable between a first pivoting state, in which the upper movable pin is engaged with the upper guide and the lower movable pin is disengaged from the lower guide, and a second pivoting state, in which the lower movable pin is engaged with the lower guide and the upper movable pin is disengaged from the upper guide.

12 Claims, 9 Drawing Sheets

MOVABLE DISPLAY DEVICE

RELATED APPLICATION

The present application claims priority to Japanese Patent Application Number 2015-224235, filed Nov. 16, 2015, the entirety of which is hereby incorporated by reference.

BACKGROUND

1. Field of the Disclosure

The present disclosure relates to a movable display device having a display body, disposed in front of a chassis, that is tilted so that the tilted orientation can be changed, and more particularly to a tilting mechanism that can tilt a display body in two directions, upwardly and downwardly.

2. Description of the Related Art

With a known movable display device, a display body having a display panel such as a liquid crystal display (LCD) is disposed in front of a chassis, and a sliding member disposed in the chassis is moved in the forward-backward direction so that the orientation of the display body can be changed (see Japanese Unexamined Patent Application Publication No. 10-51712, for example).

With the movable display device disclosed in Japanese Unexamined Patent Application Publication No. 10-51712, a guide pin at the upper end of a display body is slidably engaged with a guide groove formed in the chassis, and the forward end of the sliding member is rotatably linked to the lower end of the display body. When the sliding member moves from a retracted position to an advanced position, the display body changes from an erected orientation to a backward tilted orientation, in which the lower end of the display body protrudes forwardly.

With the movable display device structured as described above, an angle through which the display body is tilted backwardly changes according to the amount of the movement of the sliding member. Therefore, the display surface of the display body can be adjusted to a backward tilted angle at which the passenger can easily view the display body. However, to avoid reflected sunlight, a reflected landscape, and other problems, a movable display device is desired that enables the display body to be tilted not only to the backward tilted orientation but also to the forward tilted orientation.

Figure 12:
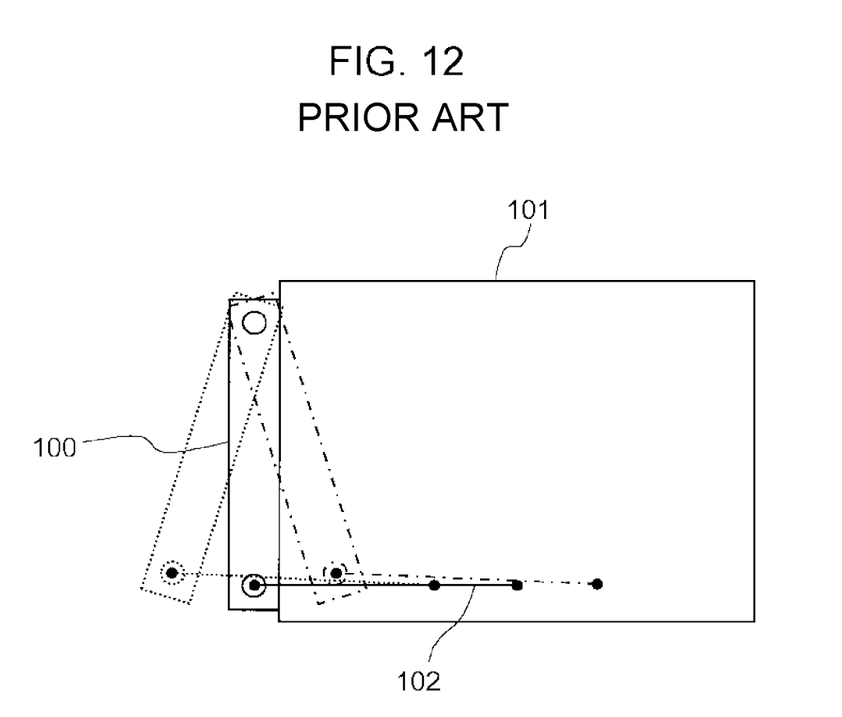
FIG. 12 schematically illustrates the structure of a conventionally proposed movable display device.

A possible example of this type of movable display device is illustrated in FIG. 12. In this example, the upper end of a display body 100 is pivotably supported by a chassis 101 so as to be rotatable, and the lower end of the display body 100 is rotatably linked to a sliding member 102. When the sliding member 102 is moved forwardly and backwardly from an initial position, the display body 100 can be tilted to both the backward tilted orientation and the forward tilted orientation. Specifically, when the sliding member 102 is moved forwardly (to the left in FIG. 12) from the initial position, the display body 100 can be tilted from an erected orientation indicated by solid lines to a backward tilted orientation indicated by dotted lines. In addition, when the sliding member 102 is moved backwardly (to the right in FIG. 12) from the initial position, the display body 100 can be tilted from the erected orientation to a forward tilted orientation indicated by dash-dot lines.

Another example of a movable display device is proposed in Japanese Unexamined Patent Application Publication No. 2006-276769. In this example, an upper sliding member and a lower sliding member are provided in a chassis so as to be movable in the forward-backward direction. The forward end of the upper sliding member is disengageably linked to an upper pin attached to the upper end of the display body. The forward end of the lower sliding member is disengageably linked to a lower pin attached to the lower end of the display body. The upper pin and lower pin are slidably engaged with guide grooves formed in the chassis. With the movable display device structured in this way, when the lower sliding member is advanced while the upper sliding member is stopped at the retracted position, the upper pin comes off a linking portion linked to the upper sliding member and is lowered in the guide groove. Then, the display body rotates around the lower pin and is placed in the backward tilted orientation, in which the lower end protrudes forwardly. Conversely, when the upper sliding member is advanced while the lower sliding member is stopped at the retracted position, the lower pin comes off a linking portion linked to the lower sliding member and is raised in the guide groove. Then, the display body rotates around the upper pin and is placed in the forward tilted orientation, in which the upper end protrudes forwardly.

With the movable display device illustrated in FIG. 12, however, when the display body is tilted to the forward tilted orientation (moved to the position indicated by dash-dot lines, the display body moves so that its lower end is retracted with the upper end of the chassis acting as a rotational fulcrum, so a space sufficient for the lower end of the display body to retract needs to be allocated in the chassis. This is problematic in that a space, in the chassis, in which to place parts is narrowed by the space allocated to accommodate the lower end of the display body.

With the movable display device described in Japanese Unexamined Patent Application Publication No. 2006-276769, a driving mechanism that operates the upper sliding member and a driving mechanism that operates the lower sliding member need to be placed separately in the chassis. This is also problematic in that a space in the chassis is narrowed by the two driving mechanisms.

SUMMARY

The present disclosure addresses the above situations of the conventional technologies with an object of providing a movable display device that enables a display body to be tilted in two directions, upwardly and downwardly, without a space in a chassis being narrowed.

To achieve the above object, the movable display device in one embodiment of the present invention includes a chassis, a sliding member supported by the interior of the chassis so as to be slidable in the forward-backward direction, and a display body disposed in front of the chassis, the display body being tilted so as to change a tilted orientation in synchronization with a sliding operation of the sliding member; the movable display device further includes an upper bearing part formed on the upper side of the chassis, a lower bearing part formed on the lower side of the chassis, an upper pivoting part provided on the upper side of the display body so as to be engageable with and disengageable from the upper bearing part, a lower pivoting part provided on the lower side of the display body so as to be engageable with and disengageable from the lower bearing part, and a fulcrum switching mechanism that makes the rotational fulcrum of the display body switchable between a first pivoting state and a second pivoting state; the front end of the sliding member is rotatably linked to the display body at an intermediate point between the upper pivoting part and the lower pivoting part; the display body is structured so that the upper pivoting part is engaged with the upper bearing part and the lower pivoting part is disengaged from the lower bearing part in the first pivoting state, and that the lower pivoting part is engaged with the lower bearing part and the upper pivoting part is disengaged from the upper bearing part in the second pivoting state.

With the movable display device structured as described above, the display body is tilted to an upward or downward orientation along with the sliding movement of the sliding member in the forward-backward direction just by switching the rotational fulcrum of the display body between the first pivoting state and the second pivoting state. Therefore, the display body can be tilted in both the upward direction and the downward direction without narrowing a space in the chassis in which to place parts.

In the above structure, the fulcrum switching mechanism places the rotational fulcrum of the display body in an intermediate state before making the rotational fulcrum switchable to the first pivoting state or second pivoting state. In the intermediate state, the movable display device is preferably structured so that the upper pivoting part is engaged with the upper bearing part and the lower pivoting part is engaged with the lower bearing part so that a switchover can be smoothly and reliably made between directions in which the display body is tilted.

In the above structure, the fulcrum switching mechanism that makes the rotational fulcrum of the display body switchable between the first pivoting state and the second pivoting state preferably has a switching lever that moves the upper pivoting part and the lower pivoting part in mutually opposite directions and also preferably has a driving arm that operates the switching lever. The switching lever preferably is provided on both the right and left sides of the display body. Accordingly, the switching operation of the fulcrum switching mechanism can be stabilized.

In this case, the driving arm may be manually operated by the user (passenger). However, the movable display device preferably has a driving control means that controls the sliding member and fulcrum switching mechanism. The driving arm preferably is driven by using a motor as a driving source. After the driving control means controls this motor and switches the rotational fulcrum of the display body to one of the first pivoting state and second pivoting state, the driving control means preferably performs driving control so as to advance the sliding member.

According to the movable display device in the present disclosure, the display body can be tilted in both the upward direction and the downward direction without narrowing a space in the chassis.

DETAILED DESCRIPTION OF THE PREFERRED EMBODIMENTS

Figure 1:
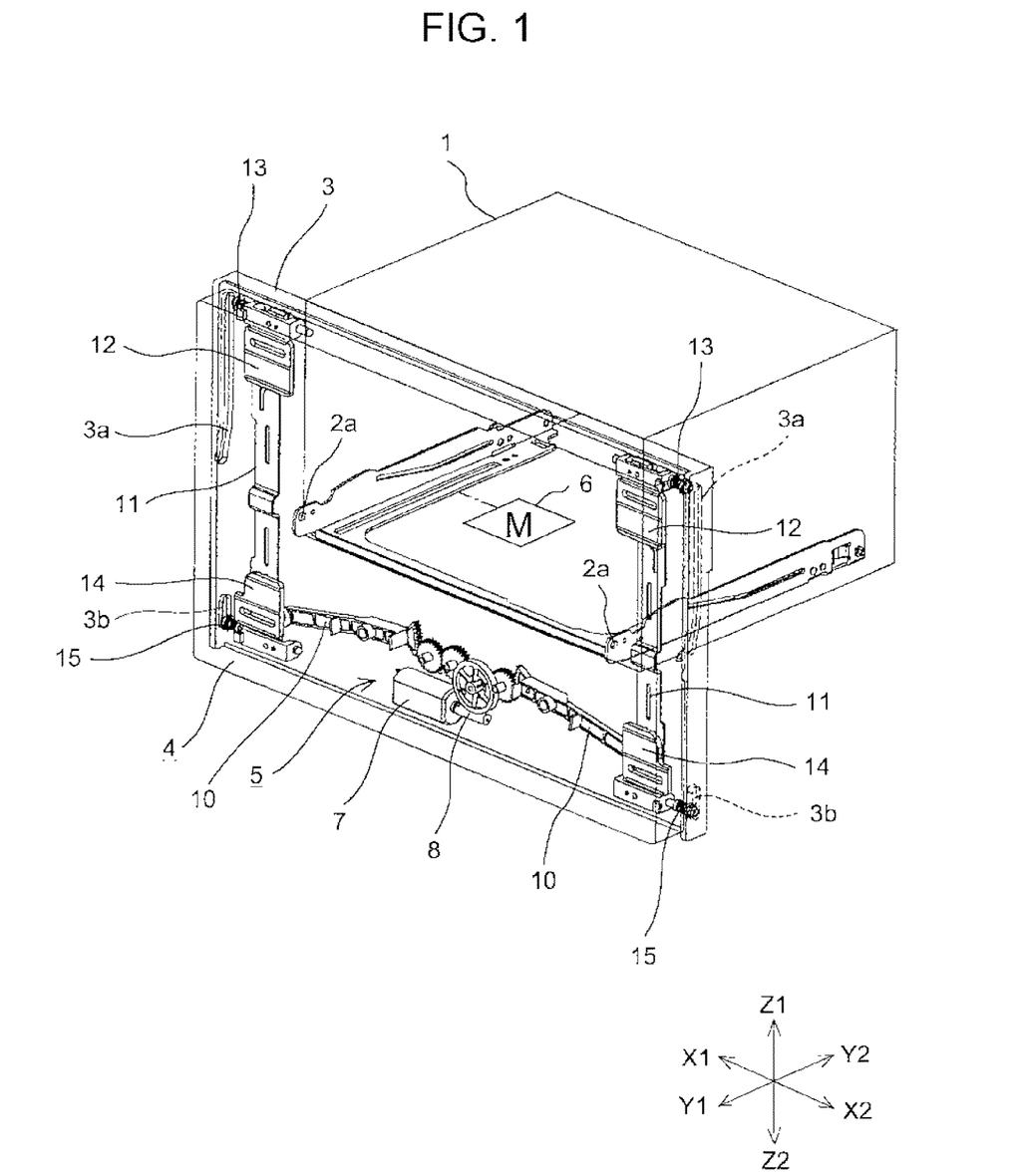
FIG. 1 is a perspective view that schematically illustrates the structure of a movable display device in an embodiment of the present invention.

An embodiment of the present invention will be described with reference to the drawings. As illustrated in FIG. 1, a movable display device in an embodiment of the present invention includes a chassis 1 that has an opening in the front surface and is shaped like a box, a sliding member 2 supported at the interior of the chassis 1 so as to be slidable in the forward-backward direction (Y1-Y2 direction), an escutcheon 3 that is shaped like a frame and is integrally attached to the front surface of the chassis 1, a display body 4 disposed in front of the escutcheon 3, a fulcrum switching mechanism 5 incorporated into the display body 4, and other components.

The whole of the sliding member 2 is U-shaped in a plan view. The sliding member 2 is driven by using a motor 6 as a driving source and reciprocates on the bottom surface of the chassis 1 in the forward-backward direction. The amount of rotation of the motor 6 and the direction of the rotation are controlled by a driving control unit 20 (see FIG. 9), which will be described later. The driving control unit 20 accepts, for example, detection signals from position detection switches that detect the position of the sliding member 2 in the forward-backward direction. At the forward end, the sliding member 2 has shaft holes 2a at both sides in the left-right direction (X1-X2 direction). These shaft holes 2a are rotatably linked to a shaft 4a provided near the center of both sides of the display body 4.

The escutcheon 3 is formed so as to be larger than the opening in the front surface of the chassis 1. The lower side of the escutcheon 3 protrudes from the bottom surface of the chassis 1. Upper guides 3a (upper bearing parts) are formed in a groove shape on the upper sides of both inner surfaces of the escutcheon 3. Each upper guide 3a extends in the up-down direction (Z1-Z2 direction) of the chassis 1. Lower guides 3b (lower bearing parts) are also formed in a groove shape on the lower sides of both inner surfaces of the escutcheon 3. Each lower guide 3b also extends in the up-down direction of the chassis 1. However, the lower guide 3b is shorter than the upper guide 3a.

A display panel (not illustrated) such as a liquid crystal display (LCD) is mounted on the display body 4. The display surface of the display panel is exposed to the front surface of the display body 4. Components of the fulcrum switching mechanism 5 are disposed on the rear surface side of the display panel. The fulcrum switching mechanism 5 switches the rotational fulcrum of the display body 4 with respect to the chassis 1 (escutcheon 3) between a first pivoting state and a second pivoting state, which will be described later.

As illustrated in FIGS. 1 to 4, the main components of the fulcrum switching mechanism 5 are a motor 7, which is a driving source, a gear train 9 engaged with a worm gear 8 secured to the rotational axis of the motor 7, a pair of driving arms 10, each of which is rotatably engaged with a gear at an end of the gear train 9, a pair of switching levers 11, each of which is linked to the relevant driving arm 10 so as to be movable in the up-down direction, a pair of upper relay levers 12, each of which is linked to the upper end of the relevant switching lever 11 so as to be movable in the left-right direction, a pair of upper movable pins 13 (upper pivoting parts), each of which is secured to the relevant upper relay lever 12 and integrally moves, a pair of lower relay levers 14, each of which is linked to the lower end of the relevant switching lever 11 so as to be movable in the left-right direction, and a pair of lower movable pins 15 (lower pivoting parts), each of which is secured to the relevant lower relay lever 14 and integrally moves.

The motor 7 is mounted near the center of the bottom surface of the display body 4. The amount of rotation of the motor 7 and the direction of the rotation are also controlled by the driving control unit 20. The driving control unit 20 accepts detection signals from position detection switches (see FIG. 9) that detect the position of the switching lever 11 in the up-down direction as well.

The pair of driving arms 10 are disposed at the right and left of the gear train 9. These driving arms 10 rotate around shafts 16 in mutually opposite directions. The outer end of each driving arm 10 is linked to the lower end of the relevant switching lever 11. The rotational motion of the driving arm 10 is converted to the linear motion of the switching lever 11 through this linking portion between the driving arm 10 and the switching lever 11.

The pair of switching lever 11 are supported to the right and left sides of the display body 4 so as to be movable in the up-down direction (Z1-Z2 direction). A cam hole 11a and a cam hole 11b are respectively formed in a stepped shape at the upper end and lower end of each switching lever 11. A pin 12a provided on the upper relay lever 12 is inserted into the cam hole 11a at the upper end. A pin 14a provided on the lower relay lever 14 is inserted into the cam hole 11b at the lower end. Thus, the linear motion of the switching lever 11 in the up-down direction is converted to the linear motion of the upper relay lever 12 in the left-right direction through the cam hole 11a and the pin 12a and to the linear motion of the lower relay lever 14 in the left-right direction through the cam hole 11b and the pin 14a.

Each of the pair of upper movable pins 13 moves in the left-right direction together with the relevant upper relay lever 12. The upper movable pin 13 can be engaged with and disengaged from the relevant upper guide 3a provided on the escutcheon 3. Each of the pair of lower movable pins 15 moves in the left-right direction together with the relevant lower relay lever 14. The lower movable pin 15 can be engaged with and disengaged from the relevant lower guide 3b provided on the escutcheon 3.

Figure 2:
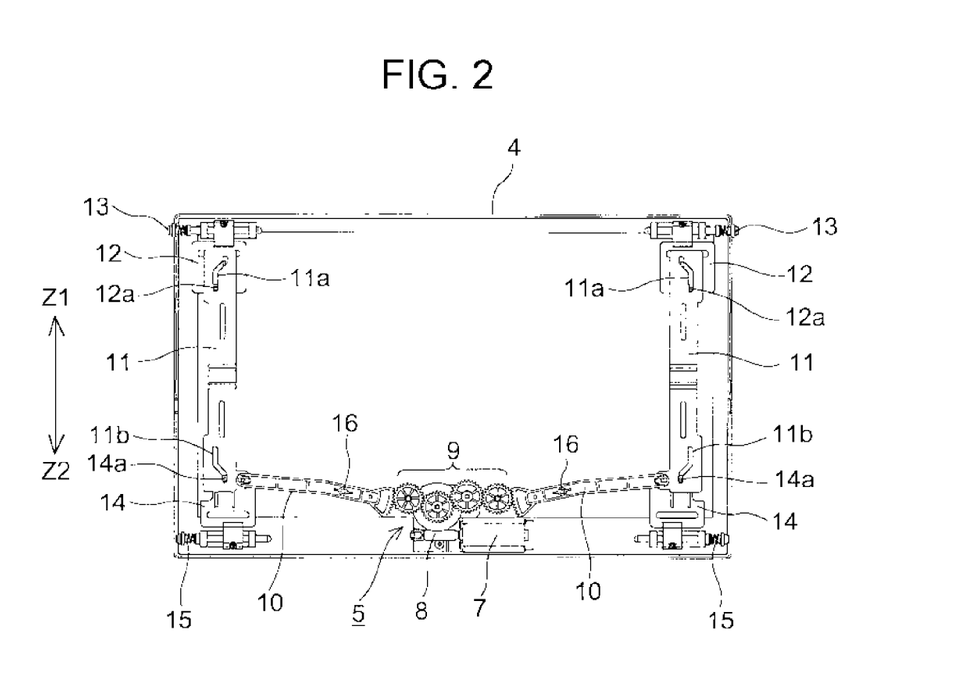
FIG. 2 illustrates a first pivoting state made by a fulcrum switching mechanism provided in the movable display device, as viewed from the rear surface of the movable display device.

That is, as illustrated in FIG. 2, when the switching lever 11 is positioned at the top position, the upper movable pin 13 protrudes from the relevant side surface of the display body 4 but the lower movable pin 15 is inside the side surface of the display body 4, so the display body 4 is in the first pivoting state, in which the upper movable pin 13 is engaged with the upper guide 3a and the lower movable pin 15 is disengaged from the lower guide 3b.

Figure 3:
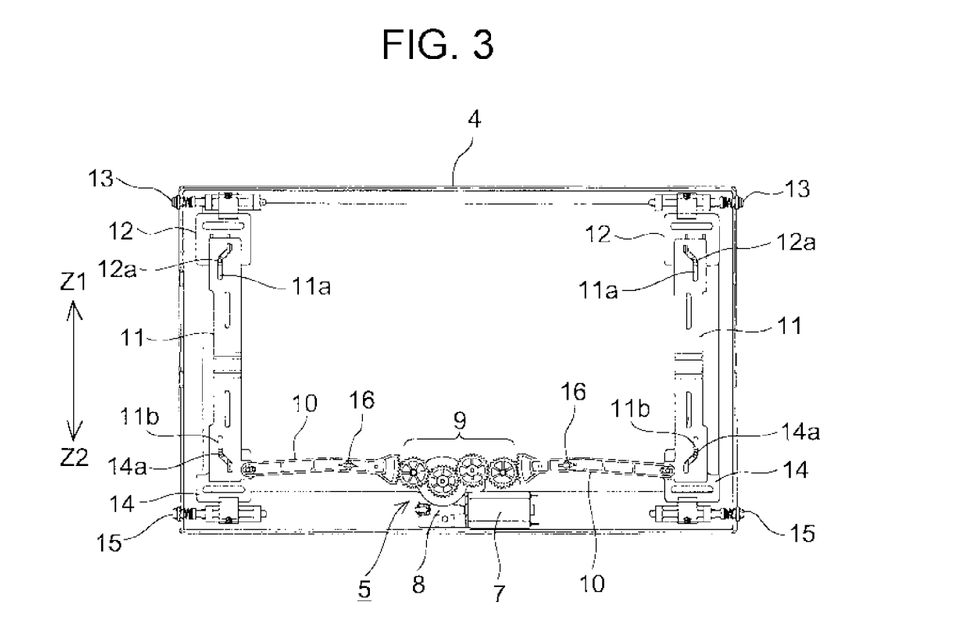
FIG. 3 illustrates an intermediate state made by the fulcrum switching mechanism, as viewed from the rear surface of the movable display device.

When, in this state, the switching lever 11 moves downwardly (in the Z2 direction) from the top position due to the rotation of the motor 7, the pin 12a on the upper relay lever 12 moves in the perpendicular portion of the cam hole 11a on the upper side, as illustrated in FIG. 3. Therefore, the upper movable pin 13 maintains its state in which the upper movable pin 13 protrudes from the side surface of the display body 4. Since the pin 14a on the lower relay lever 14 moves in the inclined portion of the cam hole 11b on the lower side, however, the lower movable pin 15 protrudes from the side surface of the display body 4. As a result, the display body 4 enters a state in which the upper movable pin 13 is engaged with the upper guide 3a and the lower movable pin 15 is engaged with the lower guide 3b (this state is referred to as the intermediate state).

Figure 4:
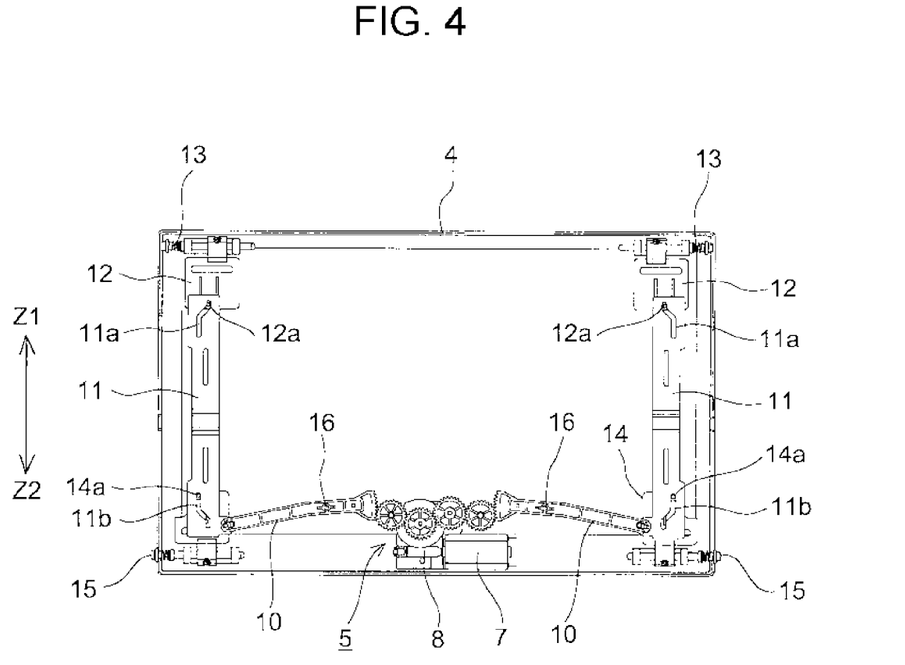
FIG. 4 illustrates a second pivoting state made by the fulcrum switching mechanism, as viewed from the rear surface of the movable display device.

When the motor 7 further rotates and the switching lever 11 moves to the bottom position, the pin 12a on the upper relay lever 12 passes through the perpendicular portion of the cam hole 11a on the upper side and moves in the inclined portion as illustrated in FIG. 4. Therefore, the upper movable pin 13 moves to a position inside the side surface of the display body 4. At the same time, the pin 14a on the lower relay lever 14 passes through the inclined portion of the cam hole 11b and moves in the perpendicular portion, so the lower movable pin 15 maintains its state in which the lower movable pin 15 protrudes from the side surface of the display body 4. As a result, the display body 4 enters the second pivoting state, in which the lower movable pin 15 is engaged with the lower guide 3b and the upper movable pin 13 is disengaged from the upper guide 3a.

When the fulcrum switching mechanism 5 switches the rotational fulcrum of the display body 4 between the first pivoting state and the second pivoting state as described above, the display body 4 can be tilted not only to the forward tilted orientation but also to the backward tilted orientation as the sliding member 2 slides in the forward-backward direction as illustrated in FIGS. 5 to 8.

Figure 5:
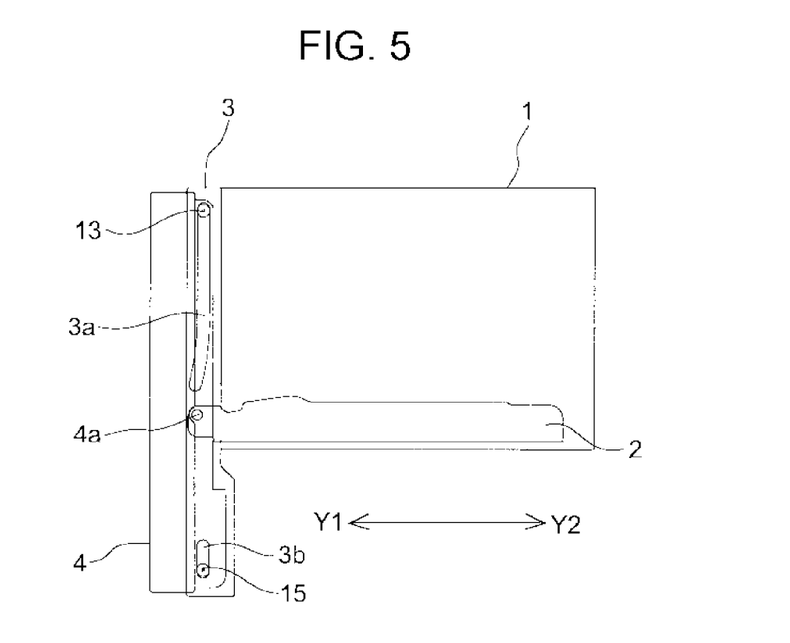
FIG. 5 illustrates a state in which a display body of the movable display device is erected.

FIG. 5 illustrates a closed state in which the opening in the front surface of the chassis 1 is covered by the display body 4 while the display body 4 is held in the erected orientation in front of the escutcheon 3. In the closed state, the sliding member 2 is located at the extreme end in the retracting direction (Y2 direction) and the pivoting state of the display body 4 with respect to the chassis 1 is the intermediate state, in which the upper movable pin 13 is engaged with the upper end of the upper guide 3a and the lower movable pin 15 is engaged with the lower end of the lower guide 3b.

Figure 6:
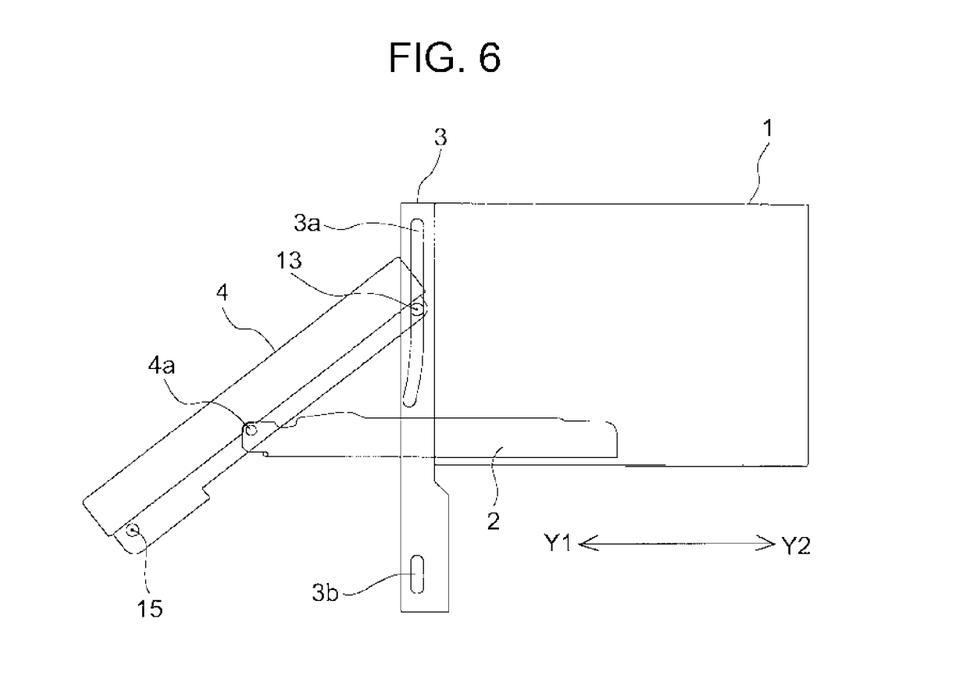
FIG. 6 illustrates a normal tilting operation of the display body.
Figure 7:
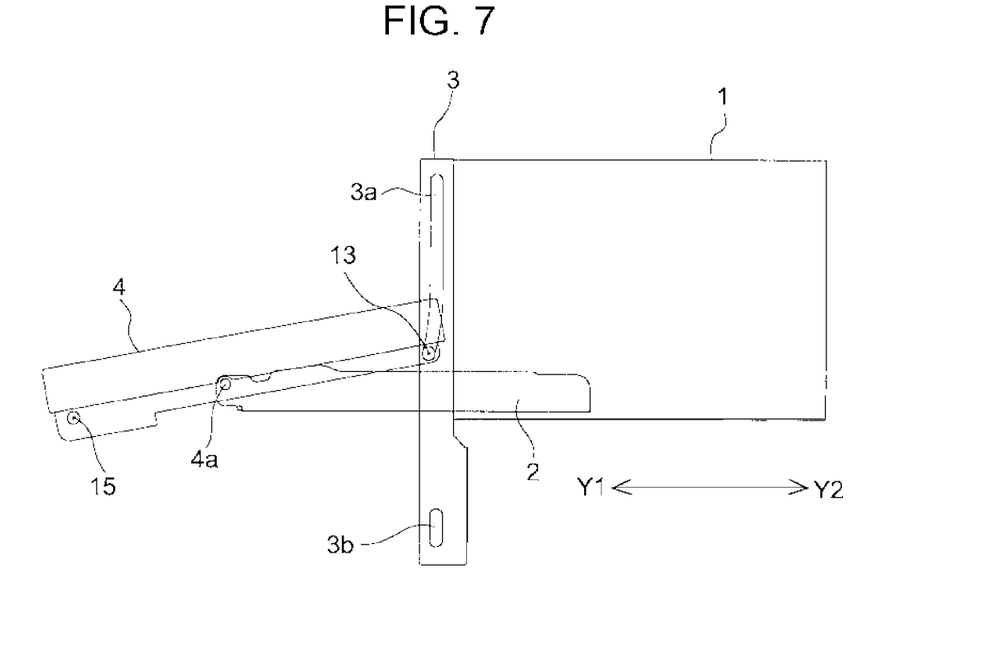
FIG. 7 illustrates a state in which the display body has been moved to a backward tilted orientation.

When, in this state, the lower movable pin 15 and lower guide 3b are disengaged from each other due to the action of the fulcrum switching mechanism 5, that is, the display body 4 is switched from the intermediate state to the first pivoting state, and then the sliding member 2 is moved in the advancing direction (Y1 direction), the upper movable pin 13 is slid downwardly in the upper guide 3a and the display body 4 changes from the erected orientation to the backward tilted orientation, in which the lower end protrudes forwardly, as illustrated in FIG. 6. When the sliding member 2 moves to the extreme end in the advancing direction, the upper movable pin 13 moves to the lower end of the upper guide 3a and the display body 4 is tilted to the maximum backward tilting angle and enters an open state, as illustrated in FIG. 7.

Figure 8:
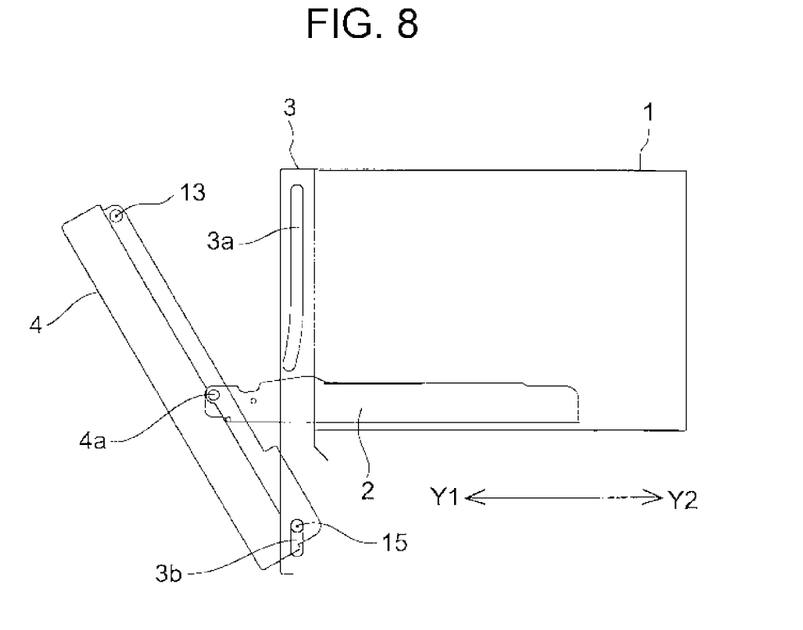
FIG. 8 illustrates a reverse tilting operation of the display body.

By contrast, when the upper movable pin 13 and upper guide 3a are disengaged from each other due to the action of the fulcrum switching mechanism 5 with the display body 4 held in the erected orientation, that is, the display body 4 is switched from the intermediate state to the second pivoting state, and then the sliding member 2 is moved in the advancing direction (Y1 direction), the lower movable pin 15 is slid upwardly in the lower guide 3b and the display body 4 changes from the erected orientation to the forward tilted orientation, in which the upper end protrudes forwardly, as illustrated in FIG. 8.

Next, how the driving control unit 20 described above controls the driving of the motor 6 used to drive the sliding member 2 and the motor 7 used to drive the fulcrum switching mechanism 5 will be described in detail with respect to FIGS. 9 to 11.

Figure 9:
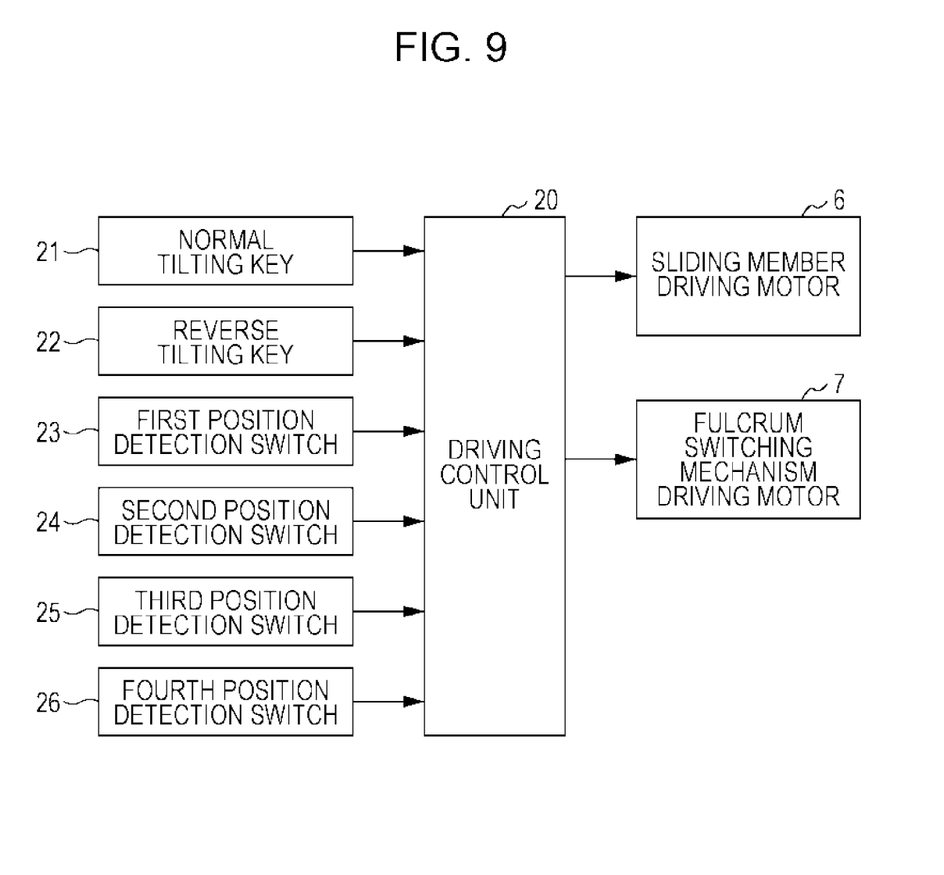
FIG. 9 is a block diagram illustrating a control driving means included in the movable display device.

As illustrated in FIG. 9, the driving control unit 20 acquires output signals from a normal tilting key 21, a reverse tilting key 22, and first to fourth position detection switches 23, 24, 25, and 26, after which the driving control unit 20 controls the amount of rotation of the motor 6 used to drive the sliding member 2 and the motor 7 used to drive the fulcrum switching mechanism 5 and also controls the direction of the rotation.

Normal tilting is an upward tilting operation (see FIG. 6) effected when the display body 4 changes to the backward tilted orientation, in which the lower end protrudes forwardly, and reverse tilting is a downward tilting operation (see FIG. 8) effected when the display body 4 changes to the forward tilted orientation, in which the lower end retracts backwardly. These operations in two directions are selectively commanded when the user manipulates the normal tilting key 21 or reverse tilting key 22. The normal tilting key 21 and the reverse tilting key 22 may be a switch, disposed along the outer edge of the front surface of the display body 4, the manipulation part of the switch being pressed by the user. Alternatively, the normal tilting key 21 and the reverse tilting key 22 may be an icon that is displayed on the display screen of a touch-type display panel and is touched by the user.

The first and second position detection switches 23 and 24 detect the position of an end in movement of the sliding member 2 in the forward-backward direction. It suffices to provide, for example, a pair of pushbutton switches at both ends in the directions in which the sliding member 2 moves so that the sliding member 2 presses these pushbutton switches. It is also possible to use encoders or variable resistors instead of switches.

The third and fourth position detection switches 25 and 26 detect the position of an end in movement of the switching lever 11 in the up-down direction. It suffices to provide, for example, a pair of pushbutton switches at both ends in the directions in which the switching lever 11 moves so that the switching lever 11 presses these pushbutton switches. It is also possible to use encoders or variable resistors instead of switches. As described above, as the switching lever 11 reciprocates in the up-down direction, the state in which the upper movable pin 13 and the lower movable pin 15 protrude from the side surface of the display body 4 changes. Therefore, the position detection switches 24 may directly detect the movements of the upper movable pin 13 and the lower movable pin 15 in the left-right direction.

Figure 10:
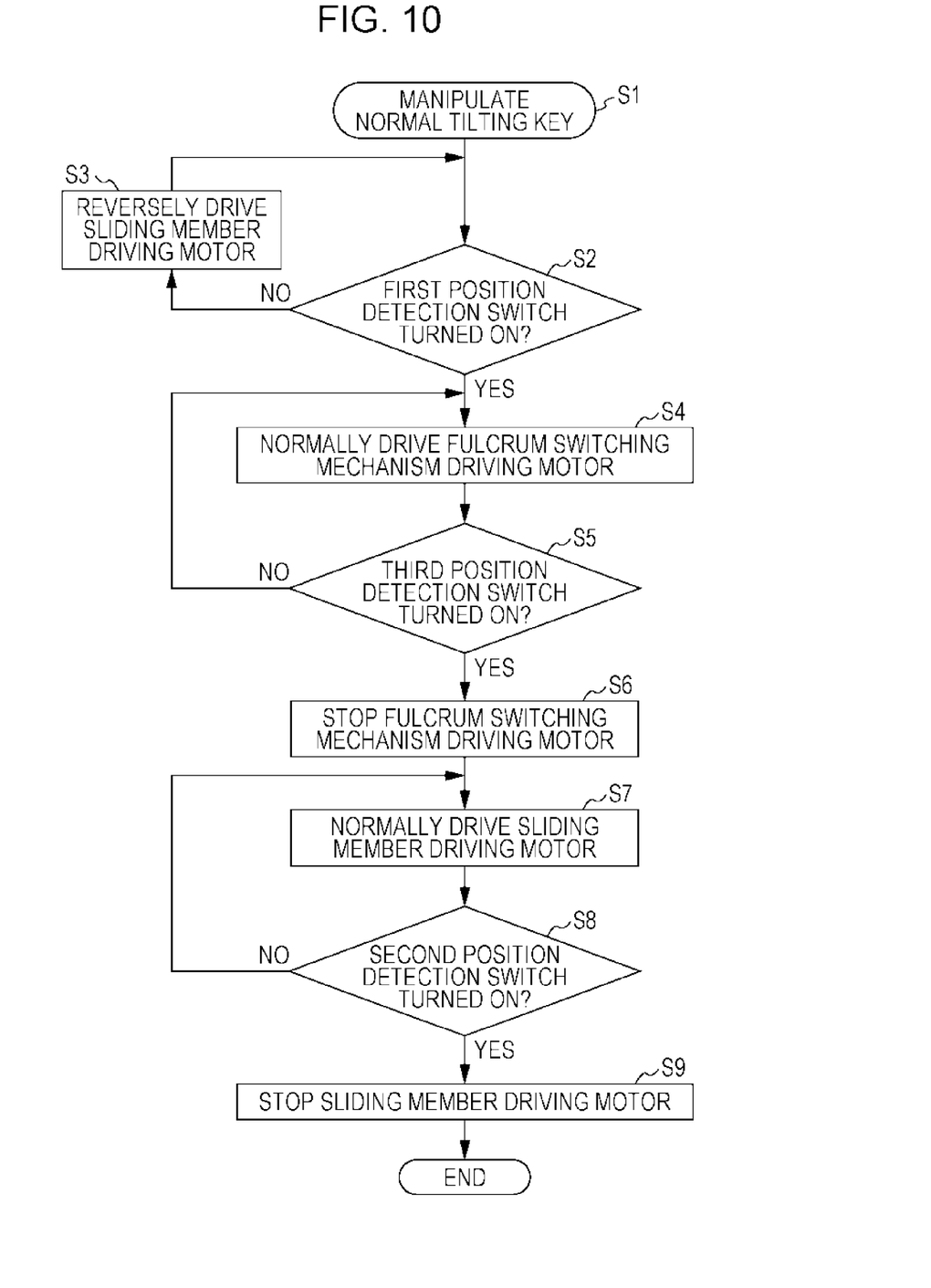
FIG. 10 is a flowchart illustrating an operation procedure followed by the control driving mechanism to perform normal tilting.

FIG. 10 is a flowchart illustrating a procedure for performing a normal tilting operation. As illustrated in the drawing, the user first manipulates the normal tilting key 21 (step S1). Then, the driving control unit 20 decides whether an output signal from the first position detection switch 23 has been turned on (step S2). Specifically, if the sliding member 2 is positioned at the extreme end in the retracting direction, an "on" signal is output from the first position detection switch 23. If, however, the sliding member 2 is positioned short of the extreme end in the retracting direction, an "on" signal is not output from the first position detection switch 23. Therefore, if the result in step S2 is No, the driving control unit 20 reversely drives the motor 6 to move the sliding member 2 to the extreme end in the retracting direction (step S3), after which, when an "on" signal is output from the first position detection switch 23, the driving control unit 20 stops the motor 6.

If the result in step S2 is Yes, the processing proceeds to step S4. In step S4, the driving control unit 20 normally drives the motor 7 used to drive the fulcrum switching mechanism 5 to move the switching lever 11 upwardly, after which the driving control unit 20 decides whether an output signal from the third position detection switch 25 has been turned on (step S5). At a time when an output signal from the third position detection switch 25 is turned on, the motor 7 is stopped (step S6). That is, when the switching lever 11 moves to the extreme end in the upward direction, the third position detection switch 25 is turned on and the lower movable pin 15 inwardly retracts from the side surface of the display body 4 at that position. Therefore, the display body 4 enters the first pivoting state, in which the upper movable pin 13 is engaged with the upper guide 3a and the lower movable pin 15 is disengaged from the lower guide 3b (see FIG. 2).

Next, the processing proceeds to step S7. In step S7, the driving control unit 20 normally drives the motor 6 used to drive the sliding member 2 to move the sliding member 2 in the advancing direction from the extreme end in the retracting direction. Then, the shaft 4a of the display body 4 is pressed forwardly and the upper movable pin 13 slides downwardly in the upper guide 3a, so the display body 4 changes from the erected orientation to the backward tilted orientation, in which the lower end protrudes forwardly (see FIG. 6).

Next, the processing proceeds to step S8. In step S8, the driving control unit 20 decides whether an "on" signal has been output from the second position detection switch 24. At a time when the second position detection switch 24 is turned on, the driving control unit 20 stops the motor 6 (step S9). That is, when the sliding member 2 moves to the extreme end in the advancing direction, the second position detection switch 24 is turned on and the display body 4 is tilted to the maximum backward tilting angle at that position and enters the open state, completing the normal tilting operation at that time.

Figure 11:
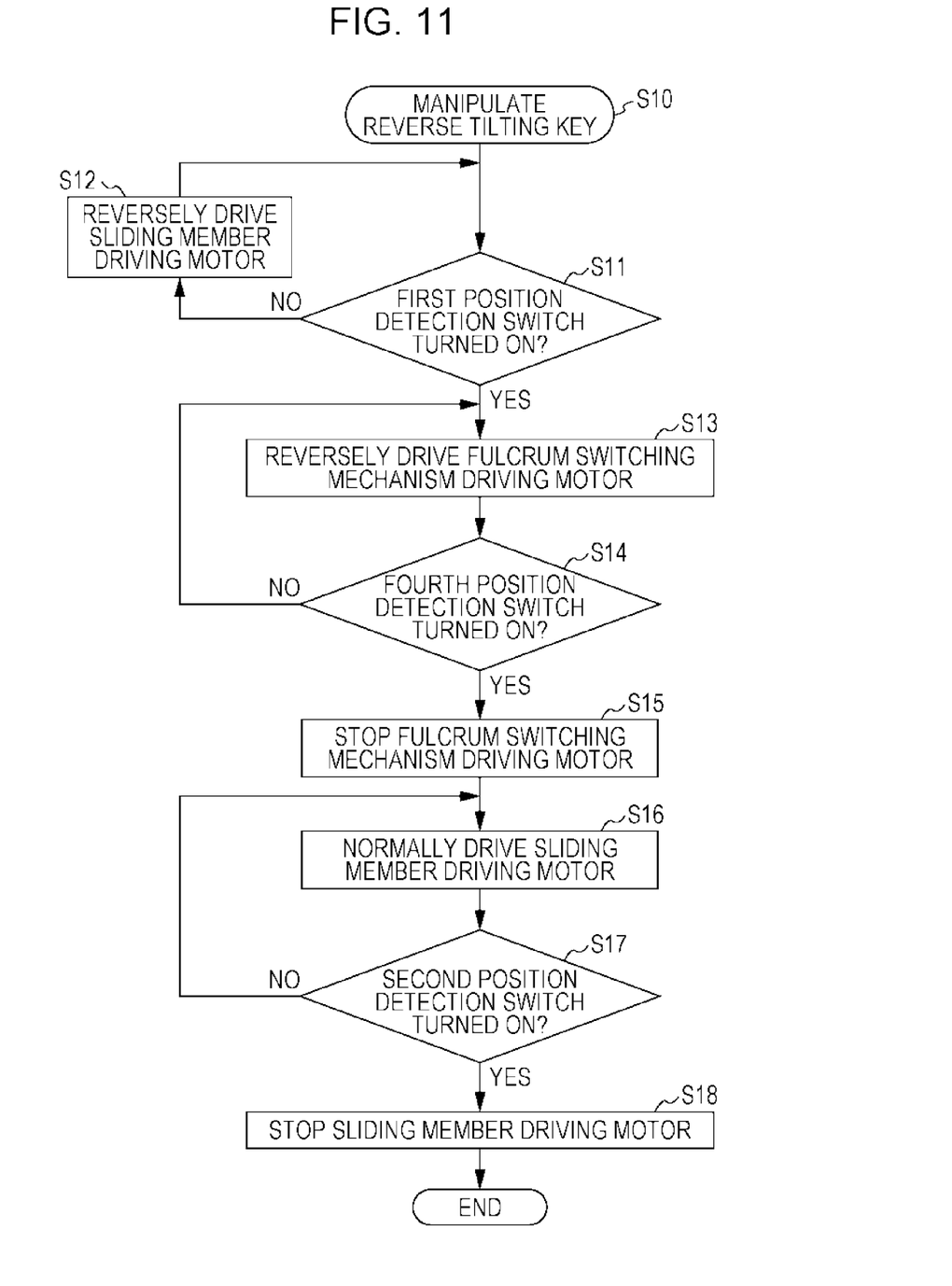
FIG. 11 is a flowchart illustrating an operation procedure followed by the control driving mechanism to perform reverse tilting.

FIG. 11 is a flowchart illustrating a procedure for performing a reverse tilting operation. This reverse tilting operation is basically the same as the normal tilting operation except for the rotational direction of the motor 7 used to drive the fulcrum switching mechanism 5.

Specifically, when the user manipulates the reverse tilting key 22 (step S10), the driving control unit 20 decides whether an "on" signal has been output from the first position detection switch 23 (step S11). If the result in step S11 is No, the driving control unit 20 normally drives the motor 6 to move the sliding member 2 to the extreme end in the retracting direction (step S12), after which, when an "on" signal is output from the first position detection switch 23, the driving control unit 20 stops the motor 6.

If the result in step S11 is Yes, the processing proceeds to step S13. In step S13, the driving control unit 20 drives the motor 7 used to drive the fulcrum switching mechanism 5 in a direction opposite to the direction in the normal tilting operation to move the switching lever 11 downwardly, after which the driving control unit 20 decides whether an output signal from the fourth position detection switch 26 has been turned on (step S14). At a time when an output signal from the fourth position detection switch 26 is turned on, the driving control unit 20 stops the motor 7 (step S15). That is, when the switching lever 11 moves to the extreme end in the downward direction, the fourth position detection switch 26 is turned on and the upper movable pin 13 retracts from the side surface of the display body 4 at that position. Therefore, the display body 4 enters the second pivoting state, in which the lower movable pin 15 is engaged with the lower guide 3b and the upper movable pin 13 is disengaged from the upper guide 3a (see FIG. 4).

Next, the processing proceeds to step S16. In step S16, the driving control unit 20 normally drives the motor 6 used to drive the sliding member 2 to move the sliding member 2 in the advancing direction from the extreme end in the retracting direction. Then, the shaft 4a of the display body 4 is pressed forwardly and the lower movable pin 15 slides upwardly in the lower guide 3b, so the display body 4 changes from the erected orientation to the forward tilted orientation, in which the upper end protrudes forwardly (see FIG. 8).

Next, the processing proceeds to step S17. In step S17, the driving control unit 20 decides whether an "on" signal has been output from the second position detection switch 24. At a time when the second position detection switch 24 is turned on, the driving control unit 20 stops the motor 6 (step S18). That is, when the sliding member 2 moves to the extreme end in the advancing direction, the second position detection switch 24 is turned on and the display body 4 is tilted to the maximum forward tilting angle at that position, completing the reverse tilting operation at that time.

When the display body 4 placed in the backward tilted orientation by the normal tilting operation is reversely tilted, the rotational fulcrum of the display body 4 is switched from the first pivoting state to the second pivoting state. Similarly, when the display body 4 placed in the forward tilted orientation by the reverse tilting operation is normally tilted, the rotational fulcrum of the display body 4 is switched from the second pivoting state to the first pivoting state. In either case, the fulcrum switching mechanism 5 places the rotational fulcrum of the display body 4 in the intermediate state (see FIG. 3) before switching the rotational fulcrum to the first pivoting state or the second pivoting state. That is, the display body 4 in the erected orientation is in the intermediate state (see FIG. 3), in which the upper movable pin 13 is engaged with the upper guide 3a and the lower movable pin 15 is engaged with the lower guide 3b. Therefore, the upper movable pin 13 does not come off the upper guide 3a, nor does the lower movable pin 15 come off the lower guide 3b, during the switching of the fulcrum of the display body 4 between the first pivoting state and the second pivoting state. This enables the display body 4 to be reliably tilted in both the normal direction and reverse direction.

As described above, the display body 4 of the movable display device in the above embodiment is tilted to an upward or downward orientation along with the sliding movement of the sliding member 2 in the forward-backward direction just by using the fulcrum switching mechanism 5 mounted in the display body 4 to switch the rotational fulcrum of the display body 4 between the first pivoting state and the second pivoting state. Therefore, the display body 4 can be tilted in both the upward direction and the downward direction without narrowing the space in the chassis 1 in which to place parts.

In the above embodiment, the fulcrum switching mechanism 5 places the rotational fulcrum of the display body 4 in the intermediate state before making the rotational fulcrum switchable to the first pivoting state or the second pivoting state. When the display body 4 is in the intermediate state, the upper movable pin 13 is engaged with the upper guide 3a and the lower movable pin 15 is engaged with the lower guide 3b. Therefore, a switchover can be smoothly and reliably made between directions in which the display body 4 is tilted.

In the above embodiment, the fulcrum switching mechanism 5 has the switching lever 11 that moves the upper movable pin 13 and lower movable pin 15 in mutual opposite directions and also has the driving arm 10 that operates the switching lever 11. Since the switching lever 11 is provided on both the right and left sides of the display body 4, it is possible to stabilize the switching operation of the fulcrum switching mechanism 5.

In the above embodiment, the driving arm 10 of the fulcrum switching mechanism 5 is rotated by using the motor 7 as a driving source so that the upper movable pin 13 and the lower movable pin 15 protrude and retract. However, an eccentric plate, for example, may be rotatably placed in the vicinity of the driving arm 10. Then, the user may manually manipulate the eccentric plate from the outside of the display body 4 to rotate the driving arm 10.

Although, in the above embodiment, the movable pins 13 and 15 are disposed on the display body 4 and the guides 3a and 3b are formed in the escutcheon 3, this may be reversed; the guides 3a and 3b may be formed in the display body 4 and the movable pins 13 and 15 may be disposed on the escutcheon 3.

In the above embodiment, the movable pins 13 and 15 on the display body 4 are fixed to the escutcheon 3 so as to be slidable in the up-down direction, and the intermediate portion of the display body 4 may be pivoted to the front end of the sliding member 2 so as not to be slidable in the up-down direction. However, this may be reversed; the intermediate portion of the display body 4 is pivoted to the front end of the sliding member 2 so as to be slidable in the up-down direction, and the movable pins 13 and 15 on the display body 4 may be fixed to the escutcheon 3 so as not to be slidable in the up-down direction.

While there has been illustrated and described what is at present contemplated to be preferred embodiments of the present invention, it will be understood by those skilled in the art that various changes and modifications may be made, and equivalents may be substituted for elements thereof without departing from the true scope of the invention. In addition, many modifications may be made to adapt a particular situation to the teachings of the invention without departing from the central scope thereof. Therefore, it is intended that this invention not be limited to the particular embodiments disclosed, but that the invention will include all embodiments falling within the scope of the appended claims.

What is claimed is:

1. A movable display device having a chassis, a sliding member supported at an interior of the chassis so as to be slidable in a forward-backward direction, and a display body disposed in front of the chassis, the display body being tilted so as to change a tilted orientation in synchronization with a sliding operation of the sliding member, the movable display device comprising:
   an upper bearing part formed on an upper side of the chassis;
   a lower bearing part formed on a lower side of the chassis;
   an upper pivoting part provided on an upper side of the display body so as to be engageable with and disengageable from the upper bearing part;
   a lower pivoting part provided on a lower side of the display body so as to be engageable with and disengageable from the lower bearing part; and a fulcrum switching mechanism that makes a rotational fulcrum of the display body switchable between a first pivoting state and a second pivoting state; wherein a front end of the sliding member is rotatably linked to the display body at an intermediate point between the upper pivoting part and the lower pivoting part, and the display body is structured so that the upper pivoting part is engaged with the upper bearing part and the lower pivoting part is disengaged from the lower bearing part in the first pivoting state and that the lower pivoting part is engaged with the lower bearing part and the upper pivoting part is disengaged from the upper bearing part in the second pivoting state.

2. The movable display device according to claim 1, wherein:

the fulcrum switching mechanism places the rotational fulcrum of the display body in an intermediate state before making the rotational fulcrum switchable to the first pivoting state or to the second pivoting state; and in the intermediate state, the movable display device is structured so that the upper pivoting part is engaged with the upper bearing part and the lower pivoting part is engaged with the lower bearing part.

3. The movable display device according to claim 1, wherein the fulcrum switching mechanism has a switching lever that moves the upper pivoting part and the lower pivoting part in mutually opposite directions and also has a driving arm that operates the switching lever, the switching lever being provided on both a right side and a left side of the display body.

4. The movable display device according to claim 3, further comprising a driving control means that controls the sliding member and the fulcrum switching mechanism, wherein the driving arm is driven by using a motor as a driving source; and after the driving control means controls the motor and switches the rotational fulcrum of the display body to one of the first pivoting state and the second pivoting state, the driving control means performs driving control so as to advance the sliding member.

5. A movable display device having a chassis, a sliding member supported by the chassis so as to be slidable in a predetermined direction, and a display body disposed in front of the chassis, the display body being tilted so as to change a tilted orientation in synchronization with a sliding operation of the sliding member, the movable display device comprising:

an upper bearing part formed on one of an upper side of the chassis and an upper side of the display body;

a lower bearing part formed on one of a lower side of the chassis and a lower side of the display body;

an upper pivoting part provided on the other of the upper side of the chassis and the upper side of the display body so as to be engageable with and disengageable from the upper bearing part;

a lower pivoting part provided on the other of the lower side of the chassis and the lower side of the display body so as to be engageable with and disengageable from the lower bearing part; and a fulcrum switching mechanism that makes a rotational fulcrum of the display body switchable between a first pivoting state and a second pivoting state; wherein a front end of the sliding member is rotatably linked to the display body at an intermediate point between the upper pivoting part and the lower pivoting part, and the display body is structured so that the upper pivoting part is engaged with the upper bearing part and the lower pivoting part is disengaged from the lower bearing part in the first pivoting state and that the lower pivoting part is engaged with the lower bearing part and the upper pivoting part is disengaged from the upper bearing part in the second pivoting state.

6. The movable display device according to claim 5, wherein:

the fulcrum switching mechanism places the rotational fulcrum of the display body in an intermediate state before making the rotational fulcrum switchable to the first pivoting state or to the second pivoting state; and in the intermediate state, the movable display device is structured so that the upper pivoting part is engaged with the upper bearing part and the lower pivoting part is engaged with the lower bearing part.

7. The movable display device according to claim 5, wherein the fulcrum switching mechanism has a switching lever that moves the upper pivoting part and the lower pivoting part in mutually opposite directions and also has a driving arm that operates the switching lever, the switching lever being provided on both a right side and a left side of the display body.

8. The movable display device according to claim 7, further comprising a driving control means that controls the sliding member and the fulcrum switching mechanism, wherein the driving arm is driven by using a motor as a driving source; and after the driving control means controls the motor and switches the rotational fulcrum of the display body to one of the first pivoting state and the second pivoting state, the driving control means performs driving control so as to advance the sliding member.

9. A movable display device having a chassis, a sliding member slidable in a predetermined direction, and a display body disposed in front of the chassis, the display body being tilted so as to change a tilted orientation in synchronization with a sliding operation of the sliding member, the movable display device comprising:

an upper pivoting part provided on an upper side of the display body so as to be engageable with and disengageable from an upper bearing part formed on an upper side of the chassis; and a lower pivoting part provided on a lower side of the display body so as to be engageable with and disengageable from a lower bearing part formed on a lower side of the chassis;

wherein the sliding member is rotatably linked to the display body at an intermediate point between the upper pivoting part and the lower pivoting part, the upper pivoting part is engaged with the upper bearing part and the lower pivoting part is disengaged from the lower bearing part in a first pivoting state, and the lower pivoting part is engaged with the lower bearing part and the upper pivoting part is disengaged from the upper bearing part in a second pivoting state.

10. The movable display device according to claim 9, further comprising a fulcrum switching mechanism that makes a rotational fulcrum of the display body switchable between the first pivoting state and the second pivoting state; wherein:

the fulcrum switching mechanism places the rotational fulcrum of the display body in an intermediate state before making the rotational fulcrum switchable to the first pivoting state or to the second pivoting state; and in the intermediate state, the movable display device is structured so that the upper pivoting part is engaged with the upper bearing part and the lower pivoting part is engaged with the lower bearing part.

11. The movable display device according to claim 9, further comprising a fulcrum switching mechanism that makes a rotational fulcrum of the display body switchable between the first pivoting state and the second pivoting state; wherein the fulcrum switching mechanism has a switching lever that moves the upper pivoting part and the lower pivoting part in mutually opposite directions and also has a driving arm that operates the switching lever, the switching lever being provided on both a right side and a left side of the display body.

12. The movable display device according to claim 11, further comprising a driving control means that controls the sliding member and the fulcrum switching mechanism, wherein the driving arm is driven by using a motor as a driving source; and after the driving control means controls the motor and switches the rotational fulcrum of the display body to one of the first pivoting state and the second pivoting state, the driving control means performs driving control so as to advance the sliding member.

* * * * *